United States Patent [19]
Norimatsu

[11] Patent Number: 5,101,177
[45] Date of Patent: Mar. 31, 1992

[54] VOLTAGE CONTROLLED OSCILLATOR MOUNTED ON LAMINATED PRINTED CIRCUIT BOARD

[75] Inventor: Hidehiko Norimatsu, Tokyo, Japan

[73] Assignee: NEC Corporation, Tokyo, Japan

[21] Appl. No.: 635,015

[22] Filed: Dec. 28, 1990

[30] Foreign Application Priority Data

Dec. 28, 1989 [JP] Japan .................................. 1-343343

[51] Int. Cl.⁵ ............................................. H03B 5/12
[52] U.S. Cl. ............................. 331/117 R; 331/108 D
[58] Field of Search ............... 331/108 D, 117 R, 176, 331/116 R, 116 FE, 117 FE, 117 D

[56] References Cited

U.S. PATENT DOCUMENTS 4,574,255  3/1986  Fujii et al. ...................... 331/176 X
4,625,183  11/1986  Ma .................................. 331/117 R Primary Examiner—David Mis
Attorney, Agent, or Firm—Sughrue, Mion, Zinn, Macpeak & Seas

[57] ABSTRACT

A voltage-controlled oscillator (VCO) mounted on a laminated printed circuit board which has a surface layer, a plurality of intermediate layers, and a back layer. Various component parts of the VCO are arranged on the surface layer. One of the intermediate layers which underlies the surface layer constitutes a ground potential layer and is removed at locations thereof corresponding to the area where the parts of the VCO are positioned.

11 Claims, 2 Drawing Sheets

VOLTAGE CONTROLLED OSCILLATOR MOUNTED ON LAMINATED PRINTED CIRCUIT BOARD

BACKGROUND OF THE INVENTION

The present invention relates to a voltage-controlled oscillator (VCO) and, more particularly, to a VCO mounted on a laminated printed circuit board.

In parallel with the miniaturization of electronic equipment, the trend toward laminated printed circuit boards, or multilayer wiring boards, has been accelerated, to accommodate electronic parts and circuits in a dense arrangement. With a printed circuit board for high frequency applications, for example, it is a common practice to connect an intermediate or internal layer to ground, so that high-frequency circuitry on the surface of the board may operate stably. A substrate layer of glass epoxy or similar material intervenes between nearby ones of the successive layers.

When a VCO, for example, is mounted on such a laminated printed circuit board, one of the intermediate layers underlying the layer on which an oscillating semiconductor, or transistor, of the VCO as well as various electronic parts determining the oscillation frequency thereof are arranged is connected to ground to serve as a ground potential layer. In this configuration, a stray capacitance is developed between each of the the leads of the semiconductor, metallic parts and printed circuit pattern and the ground potential layer. Assuming that the printed circuit board has a given thickness, such stray capacitances are greater than in an ordinary printed circuit board whose back serves as a ground potential layer. The oscillation frequency, therefore, changes due to scattering among the mounting conditions of the individual parts and the change in configuration of the printed circuit pattern. Generally, the parts that determine the oscillation frequency of a VCO are implemented as parts having great Q values in order to increase the C/N (Carrier-to-Noise) ratio of the generated signal. In practice, however, the oscillation frequency of a VCO mounted on a laminated printed circuit board is determined by the composite impedance of the impedances of the parts with great Q values and stray capacitances ascribable to the glass epoxy layers. In the case where such stray capacitances have great influence on the oscillation frequency, the overall Q value and, therefore, the C/N ratio is critically lowered since glass epoxy has a small Q value.

SUMMARY OF THE INVENTION

It is therefore an object of the present invention to provide a VCO mounted on a laminated printed circuit board which generates a signal with an improved C/N ratio and stable frequency.

It is another object of the present invention to provide a generally improved VCO mounted on a laminated printed circuit board.

In accordance with the present invention, in a VCO mounted on a laminated printed circuit board having a surface layer, a plurality of intermediate layers, and a back layer, at least one of the plurality of intermediate layers functioning as a ground potential layer, the VCO has a semiconductor for oscillation and electronic component parts determining the oscillation frequency thereof which are provided on the surface layer of the printed circuit board. The ground potential layer is removed in a part thereof corresponding to the area where the semiconductor and electronic component parts are disposed.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
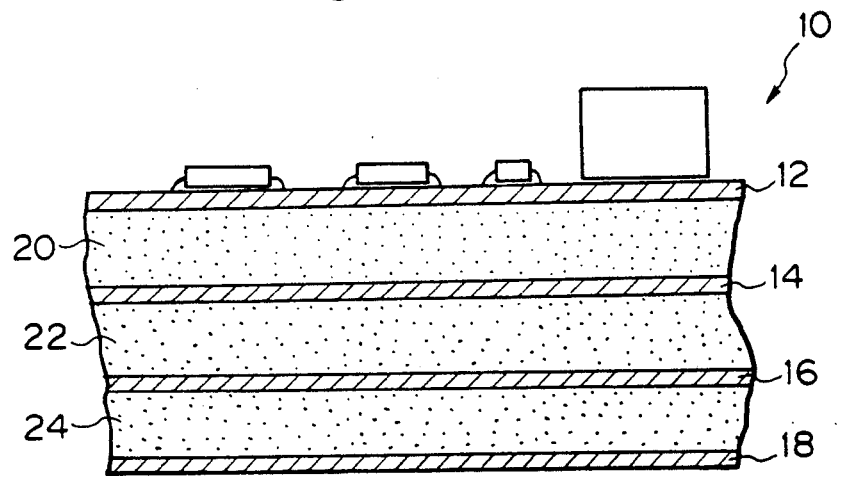
FIG. 1 is a sectional side elevation showing a specific structure of a laminated printed circuit board to which the present invention is applicable.

Referring to FIG. 1 of the drawings, a laminated printed circuit board to which the present invention is applicable is shown and generally designated by the reference numeral 10. As shown, the circuit board 10 has a first layer or surface layer 12, second and third layers or intermediate layers 14 and 16, and a fourth or back layer 18. Various component parts of a VCO including an oscillating transistor are mounted on the first layer 12. The second layer 14 is connected to ground while the third layer 16 is adapted for a power source. An electric circuit pattern is formed on the fourth layer 18. Substrate layers made of glass epoxy 20, 22 and 24 intervene between the first and second layers 12 and 14, between the second and third layers 14 and 16, and between the third and fourth layers 16 and 18, respectively.

Figure 2:
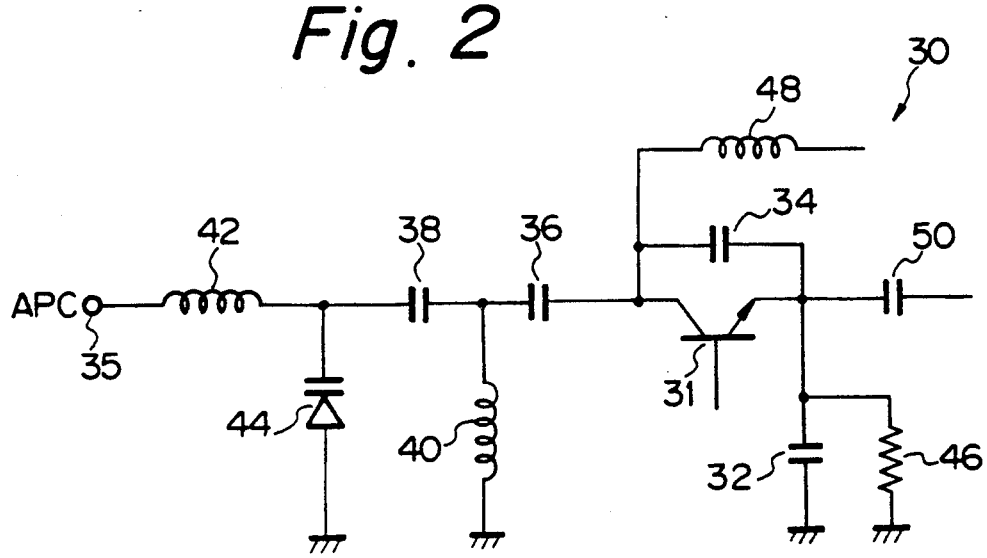
FIG. 2 is a circuit diagram representative of a VCO embodying the present invention.

A VCO embodying the present invention and having a Colpitts configuration is shown in FIG. 2. The VCO, generally 30, has an oscillating transistor 31, capacitors 32, 34, 36 and 38, an APC terminal 35, a dielectric resonator 40, a choke coil 42, and a varactor diode 44 which are the fundamental component parts for oscillation. The VCO 30 also has a resistor 46 and a choke coil 48 cooperating to apply a bias to the transistor 30, and a capacitor 50 for connecting the VCO 30 to the next stage. When an APC voltage is applied to the varactor diode 44 via the APC terminal 35 and the choke coil 42, the capacitance of the varactor diode 44 changes in matching relation to the APC voltage. The change in the capacitance of the varactor diode 44 is subjected to impedance conversion by the dielectric resonator 40 and capacitor 36 and then imparted to the collector of the transistor 30 as a change in inductance. As a result, the oscillating frequency of the transistor 30 is changed.

Figure 3:
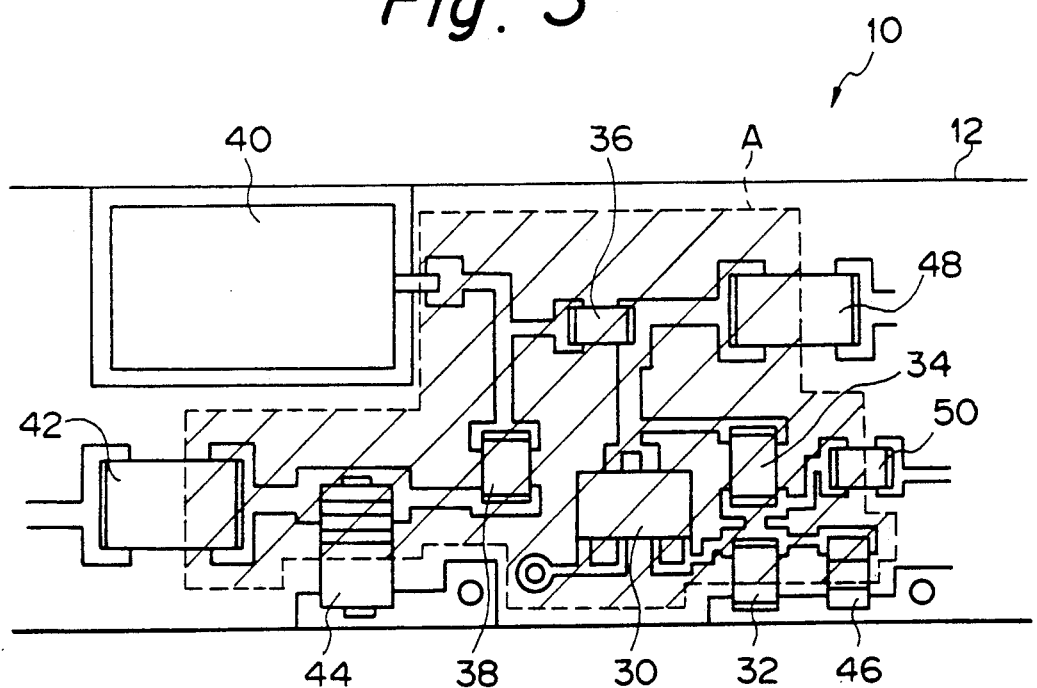
FIG. 3 is a plan view showing various component parts of the illustrative embodiment which are mounted on a first layer of the circuit board shown in FIG. 1.

FIG. 3 shows the various component parts of the VCO 30 which are mounted on the first layer 12 of the printed circuit board having the specific structure depicted in FIG. 1. The second or ground potential layer 14 underlies the first layer 12 with the intermediary of the glass epoxy substrate layer 20, as shown in FIG. 1.

A characteristic feature of the present invention is that a part of the second or ground potential layer 14 corresponding to an area A enclosed by a dashed line and indicated by hatching in FIG. 3 is removed. Generally, the stray capacitance between the ground potential layer 14 and the components provided on the surface layer 12 is inversely proportional to the distance therebetween. When the ground potential layer 14 is absent in the area A where the various components are positioned as stated above, the stray capacitance is reduced. Therefore, the ground potential layer 14 does not lower the Q values of the component parts such as the transistor 30 and resonator 40 mounted on the surface layer 12. This is successful in preventing the C/N ratio from being lowered and, therefore, in insuring a stable oscillation frequency at all times.

Figure 4:
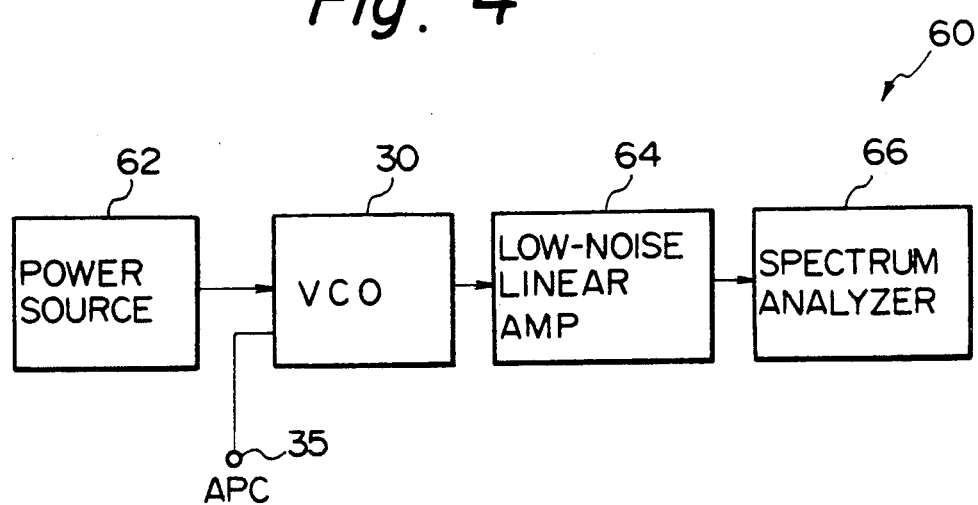
FIG. 4 is a block diagram schematically showing a specific arrangement for measuring the C/N ratio of a signal generated by the illustrative embodiment.

FIG. 4 schematically shows a specific arrangement for measuring the C/N ratio of the output signal of the VCO 30. As shown, the arrangement, generally 60, has a power source 62, a low-noise linear amplifier 64, and a spectrum analyzer 66 as well as the VCO 30, FIG. 2. The power source 62 supplies a DC voltage to the VCO 30 and an APC voltage is applied to the VCO 30 via the APC terminal 35. Assume that the printed circuit board 10 on which the VCO 30 is mounted has a four-layer structure which is 0.8 millimeter thick and has its ground potential layer 14 thereof removed over the area A shown in FIG. 3. The area in which the VCO 30 is mounted is about 2 centimeters square, and the area A is about 1.5 centimeters square. When the VCO 30 is caused to oscillate at a frequency of 1 gigahertz, the oscillation deviates by 25 kilohertz. The C/N ratio of the oscillation signal was measured to be about 85 decibels by the arrangement 60 and in the resolution bandwidth of 1 kilohertz. By contrast, when use was made of the non-modified ground potential layer 14 of the prior art, the C/N ratio was measured to be about 82 decibels. The illustrative embodiment, therefore, achieves an improvement in the C/N ratio by about 3 decibels over the prior art.

In summary, it will be seen that the present invention provides a VCO capable of generating a signal with an improved C/N ratio and stable frequency.

Various modifications will become possible for those skilled in the art after receiving the teachings of the present disclosure without departing from the scope thereof.

What is claimed is:

1. A voltage-controlled oscillator (VCO) mounted on a laminated printed circuit board having a surface layer, a plurality of intermediate layers, and a back layer, at least one of said plurality of intermediate layers functioning as a ground potential layer, said VCO including a semiconductor and electronic component parts determining an oscillation frequency of said semiconductor, said semiconductor and said electronic component parts being provided on said surface layer of said printed circuit board, and said ground potential layer being removed at locations thereof corresponding to substantial areas where said semiconductor and said electronic component parts are disposed.

2. A VCO as claimed in claim 1, wherein a substrate layer of glass epoxy intervenes between adjacent ones of said layers of said printed circuit board.

3. A VCO as claimed in claim 2, wherein said intermediate layers of said circuit board comprise said ground potential layer and a layer for a power source, whereby said printed circuit board has a four-layer structure.

4. A VCO as claimed in claim 1, wherein an electronic circuit pattern of said VCO is provided on said back layer of said printed circuit board.

5. An apparatus comprising:
   an oscillator;
   a multilayer wiring board having a surface layer, a plurality of intermediate layers and a back layer, said oscillator being mounted on said surface layer; and
   a ground potential layer constituting one of said intermediate layers, a part of said ground potential layer being removed, and at least a part of said substantial oscillator being disposed above said removed part of said ground potential layer.

6. An apparatus as claimed in claim 5, wherein said oscillator comprises a VCO.

7. An apparatus as claimed in claim 6, wherein said VCO comprises a Collpits oscillator.

8. An apparatus as claimed in claim 5, further comprising substrate layers respectively intervening between adjoining ones of said layers of said multilayer wiring board.

9. An apparatus as claimed in claim 8, wherein each of said substrate layers is comprised of glass epoxy.

10. A method of mounting oscillator circuitry on a multilayer wiring board having a ground potential layer as an intermediate layer thereof, comprising the steps of:
    mounting said oscillator circuitry on the surface layer of said board; and
    removing from said ground potential layer a part above which at least a substantial portion of said oscillator circuit is disposed.

11. A method as claimed in claim 10, further comprising the step of disposing glass epoxy substrate layers between adjoining ones of the layers of said board.

* * * * *